United States Patent [19]
Duboz et al.

[11] Patent Number: 5,712,499
[45] Date of Patent: Jan. 27, 1998

[54] LARGE PHOTODETECTOR ARRAY

[75] Inventors: Jean-Yves Duboz, Cachan; Philippe Bois, Cesson, both of France

[73] Assignee: Thomson-CSF, Paris, France

[21] Appl. No.: 555,079

[22] Filed: Nov. 8, 1995

[30] Foreign Application Priority Data

Nov. 8, 1994 [FR] France ................................ 94 13374

[51] Int. Cl.$^6$ ...................... H01L 31/062; H01L 31/113; H01L 31/00
[52] U.S. Cl. .................. 257/292; 257/291; 257/293; 257/443; 257/448; 257/459
[58] Field of Search .................. 257/448, 459, 257/292, 293

[56] References Cited

U.S. PATENT DOCUMENTS

| | | | |
|---|---|---|---|
| 4,661,713 | 4/1987 | Besson et al. | 250/578 |
| 5,115,293 | 5/1992 | Murayama et al. | 357/30 |
| 5,187,369 | 2/1993 | Kingsley et al. | 250/370.11 |
| 5,208,841 | 5/1993 | Nakanishi | 377/60 |
| 5,210,434 | 5/1993 | Ohmi et al. | 257/291 |
| 5,225,696 | 7/1993 | Bahraman | 258/291 |
| 5,260,592 | 11/1993 | Mead et al. | 257/291 |
| 5,289,023 | 2/1994 | Mead | 257/291 |
| 5,307,169 | 4/1994 | Nagasaki et al. | 348/307 |
| 5,414,294 | 5/1995 | Granneman et al. | 257/443 |

FOREIGN PATENT DOCUMENTS

| | | |
|---|---|---|
| 0 177 177 | 4/1986 | European Pat. Off. . |
| 63-172930 | 7/1988 | Japan . |
| 5-206433 | 8/1993 | Japan . |

OTHER PUBLICATIONS

Patent Abstracts of Japan, JP6204548, Jul. 22, 1994.

*Primary Examiner*—Mahshid D. Saadat
*Assistant Examiner*—Allan R. Wilson
*Attorney, Agent, or Firm*—Oblon, Spivak, McClelland, Maier & Neustadt, P.C.

[57] ABSTRACT

A photodetector arrangement capable of detecting high-power-light flux and including a set of elementary photodetectors each one of which is individually tested to determine that it has no defects. Each of the photodetectors which is found to be free of objectionable defects is connected in parallel to a common conducting line to thus produce a combined output when radiation impinges on the detector surface. The connection can be hard wired or provided through a set of transistors acting as connection control intermediaries between the good photodetectors and the common conducting line. The active areas of only good photodetectors are thus combined to form a large photodetector area of any desired shape or size without the usual reliability problems. The selective control of the transistors can further be provided by auxiliary control photodetectors to additionally automatically control the size of the active area in response to the area of light being detected or a control light beam.

3 Claims, 4 Drawing Sheets

Section aa

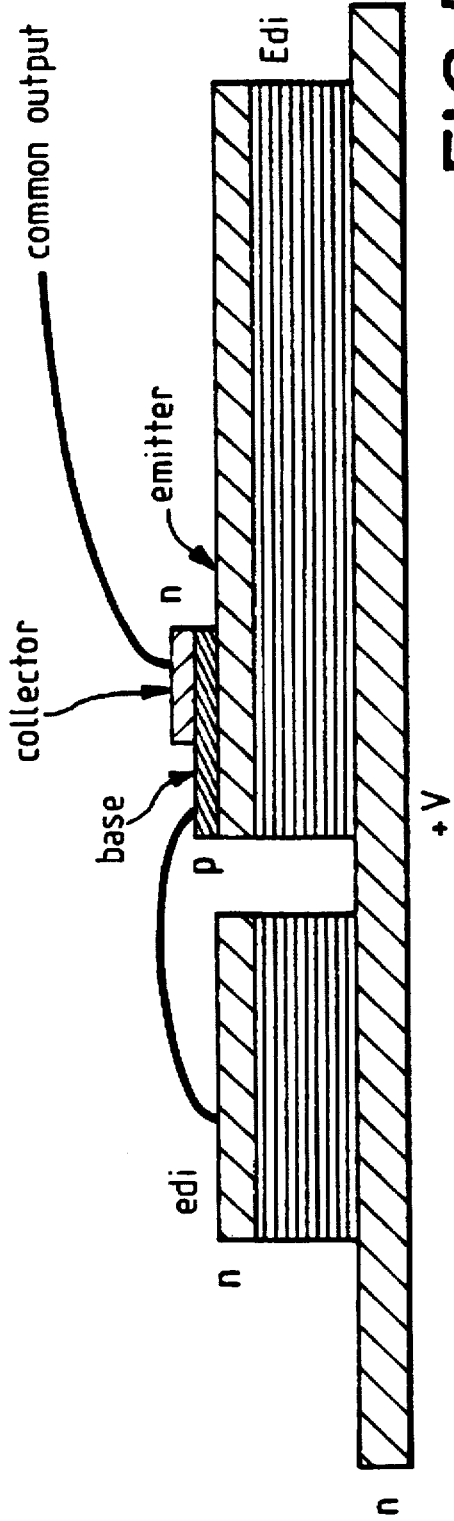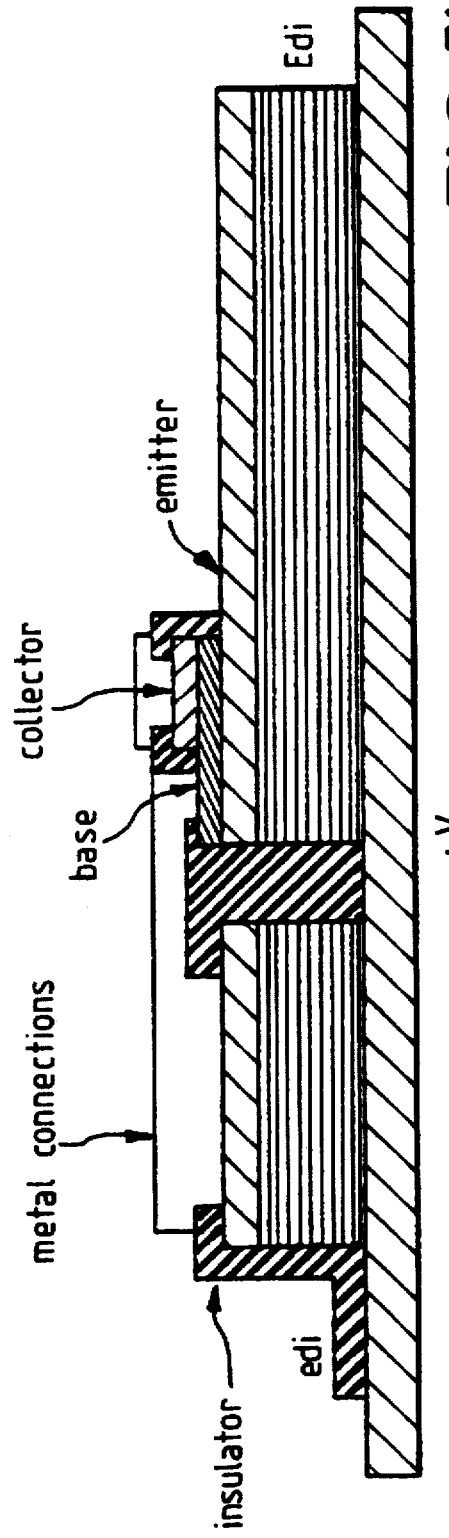

1

LARGE PHOTODETECTOR ARRAY

FIELD OF THE INVENTION

This invention concerns the subject of photodetectors, and more precisely large photodetectors for specific applications. It may be for the detection of wide laser beams, particularly in the field of long distance optical communications, or more generally for any optical instrumentation when one objective is to avoid the use of lenses, which in particular may be difficult due to the nature of the said lenses within the domain of the target wave lengths (particularly infrared).

DESCRIPTION OF THE RELATED ART

In general, regardless of the material used to make a photodetector, the probability of rendering a photodetector without any defects making it unuseable, always decreases as the size of the photodectector increases. Thus, a limiting size can be defined as being the size beyond which the probability of obtaining defect free photodetector is below a given value (for example 0.5).

The limiting size of the photodectector depends on the nature of the material being considered to make the photodectector; for example in making an infrared photodetector, limiting size is higher for it is GaAs materials than it is for HgCdTe materials and is even higher for PtSi type materials.

In parallel to this limiting size, note that high sensitivity photodetectors are usually made using crystalline semiconductor materials (in particular capable of being obtained by epitaxial growth) in which growth defects are sufficiently localized so that the quality of parts free of these defects remains good.

SUMMARY OF THE INVENTION

Taking account of these two phenomena, the invention proposes a large photodetector made by connecting elementary photodetectors, which are smaller than the previously determined size, in parallel, so that the elementary photodetectors connected in parallel have a high probability of not having any defects since only the good elementary photodetectors will be used, in order to define a large defect-free photodetector.

More precisely, the objective of the invention is a photodetector on a substrate having a common conducting line and a large number of elementary photodetectors (Edi), some of which (Edi)₁ are connected to the common conducting line (C) in parallel.

The photodetector according to the invention may advantageously contain insulating zones (I) between elementary photodetectors (Edi) and branch conducting lines (Li) in order to connect the elementary photodetectors (Edi)₁ in parallel, the said branch lines (Li) being connected to the common conducting line (Lc).

In the photodetector according to the invention, elementary photodetectors (Edi) may preferably be arranged in linear modules, or in matrix form.

Another purpose of the invention is a process for making a photodetector such as the photodetector described above, for use in making a large photodetector without any defects.

More precisely, this process of making a photodetector is characterized in that it includes the following steps:

make several photodetector elements (Edi) on a substrate (S) separated by insulating areas (I);

an individual test of correct operation of each element (Edi) in order to identify good photodetectors (Edi)₁;

parallel connection of all good photodetectors ((Edi) in order to make a photodetector which is large compared with the size of the elementary photodetectors.

The invention will be better understood and other advantages will become evident by reading the following description given as a non-limitative example, and the figures in the drawings including:

BRIEF DESCRIPTION OF THE DRAWINGS

FIG. 1a shows a top view

FIG. 1b shows a sectional view

FIGS. 5a and 5b show an example of a photodetector according to the invention in which each photodectector element (Edi), is coupled to a photodetector element (Edi):

FIG. 5a shows a section through an [(Edi), (edi)] pair in an example embodiment;

FIG. 5b also shows a section through an [(Edi), (edi)] pair in a second example embodiment.

DETAILED DESCRIPTION

In general, the photodetector according to the invention consists of a set of elementary photodetectors (Edi), the dimensions of which are smaller than limiting dimensions such that the probability that an element (Edi) is good is relatively high (at least 0.9).

FIG. 1 shows an example of large photodetectors according to the invention, in which the elementary photodetectors are arranged in matrix fashion. This is a photodetector operating on a front panel, the light being captured directly by elementary photodetectors. Each elementary photodetector (Edi) is isolated from other photodetectors by an insulating area (I). Conducting lines (Li) can typically connect selected elementary photodetectors to a common conducting line (Lc). Elementary photodetectors (Edi), in good operating condition are connected in parallel to the common conducting line (Lc) through branch line (Li) conducting elements (Ci). FIG. 1 illustrates a possible configuration in which each line of the elementary photodetector is separated from its neighbor by a branch conducting line, and it is also possible to consider having branch conducting lines only for every second column of elementary photodetectors.

Line P(a) is provided as the "low" contact which makes the photodetection measurement with the "high" contact which may be made particularly at common line (Lc).

Figure 1A:
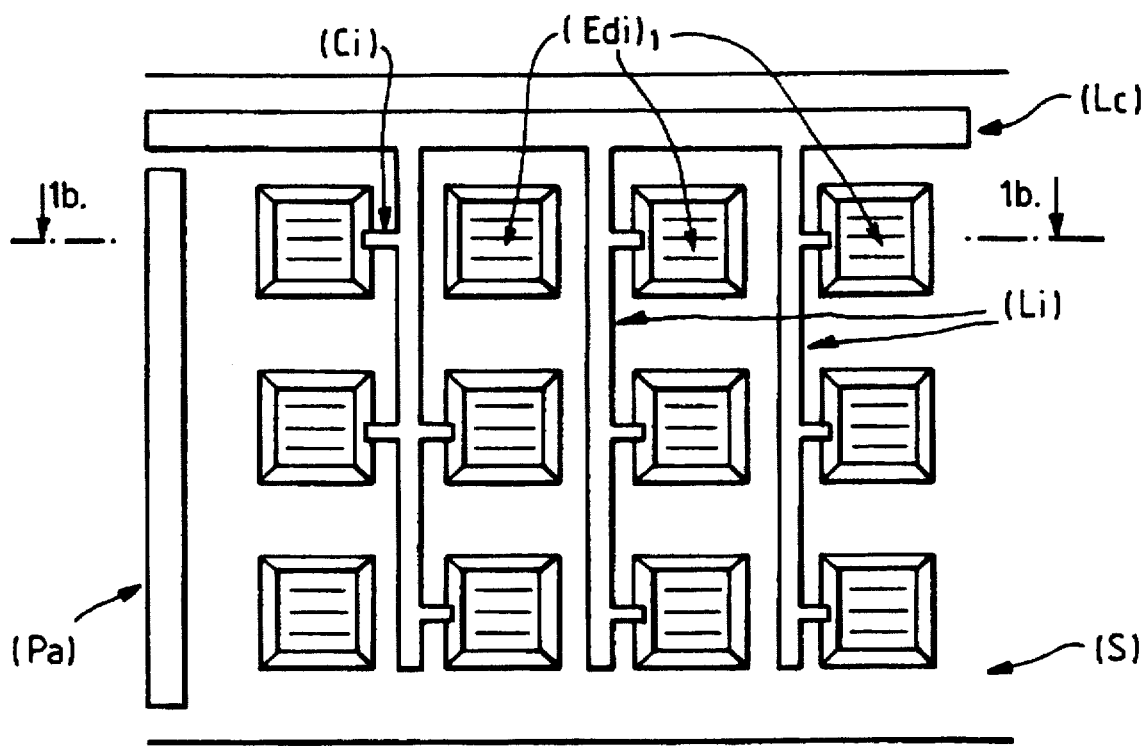
FIGS. 1a and 1b show an example of a photodetector according to the invention consisting of a matrix of elementary photodetectors.
Figure 1B:
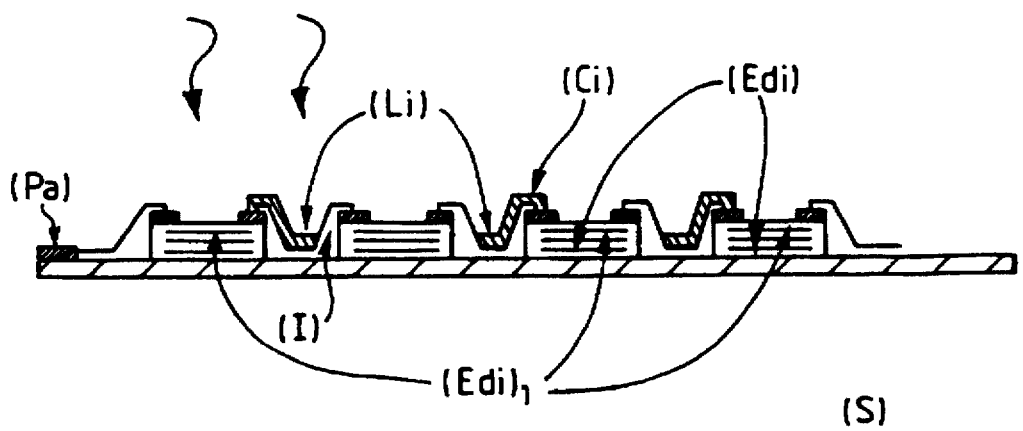
Figure 2:
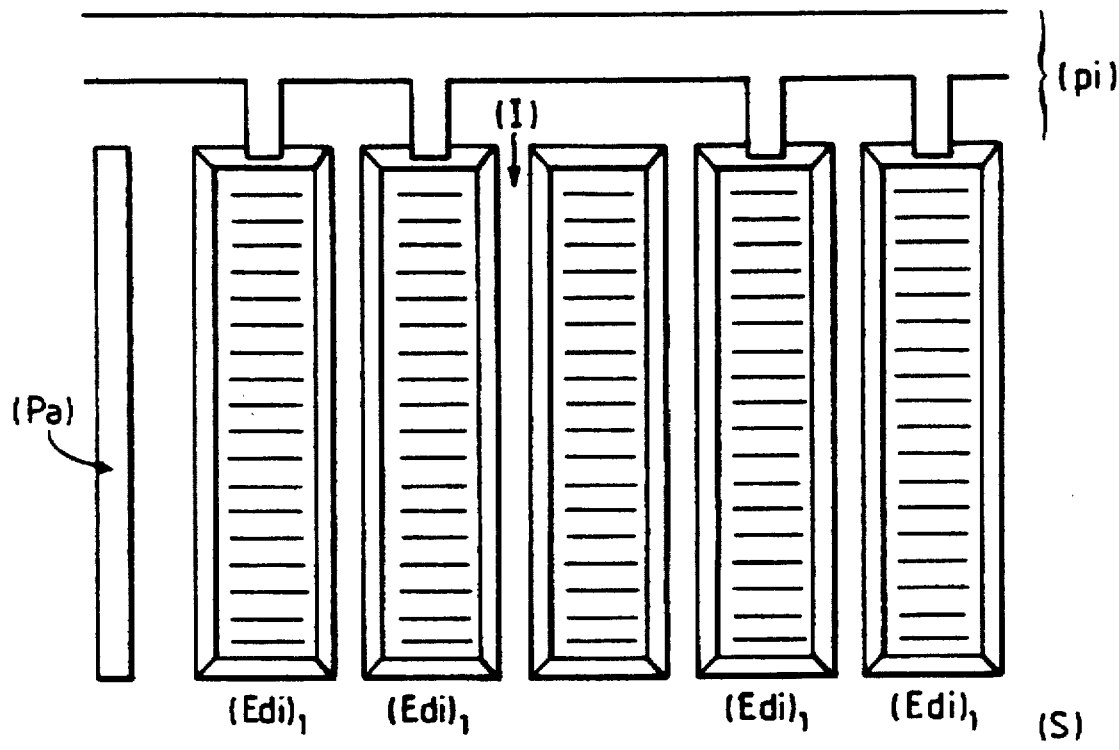
FIG. 2 shows an example of a photodetector according to the invention consisting of a set of rectangular elementary photodetectors.

It may be useful to make rectangular elementary photodetectors (Edi) larger as shown in FIG. 2. There are several possible ways of connecting these rectangular elementary photodetectors to the common line (Lc). For instance, branch conducting lines could be provided between photodetectors in order to make electrical contact with good photodetectors in exactly the same way as shown in FIGS. 1a and 1b. In the case of large rectangular elementary detectors, however, it is simpler to make a conductor comb (pi) in the insulating area (I) as shown in FIG. 2.

In an arrangement of the photodetector according to the invention, elementary photodetectors (Edi) can be connected to transistors (Ti) acting as switches to the common conducting line (Lc). It thus becomes possible to also controls the sensitive area of the photodetector as a function of the width of the light beam to be detected. This aspect is attractive in that the noise generated by a photodetector depends on its surface area. Thus, for example, it is not a good idea to use a detector with surface area s to measure the light flux in an optical beam with surface area s/4.

Figure 3:
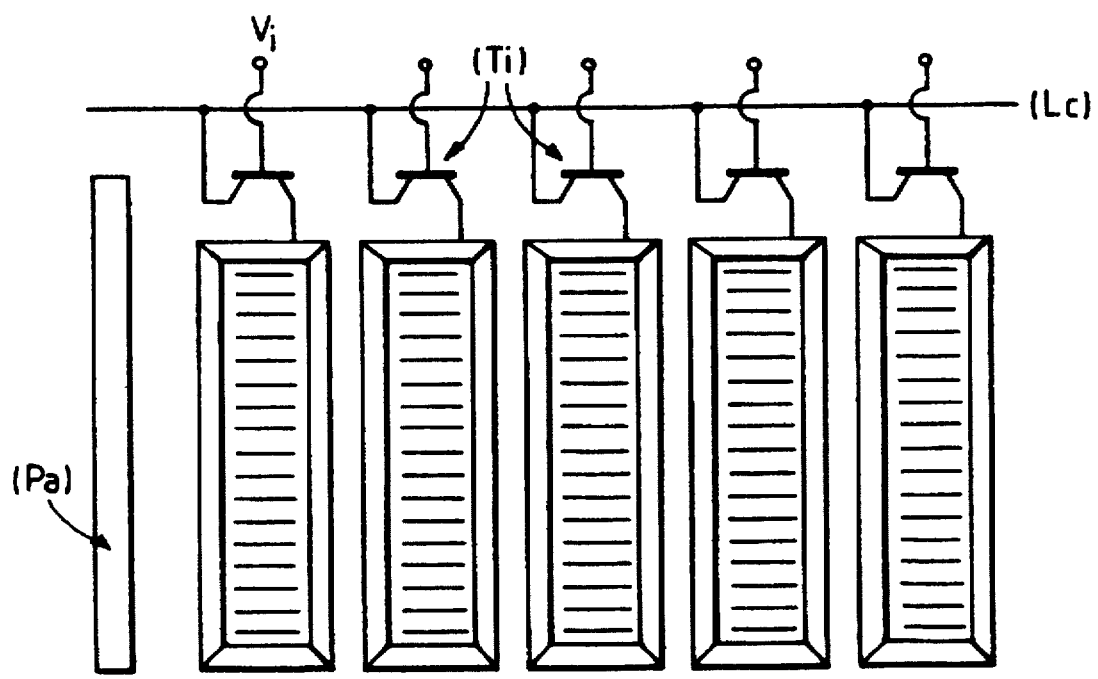
FIG. 3 schematically shows a photodetector according to the invention in which each photodectector is connected to the common conducting line (LC) through transistors.

In a first operating mode, manual addressing may be used to decide to use a specific elementary photodetector (Edi) by applying an appropriate voltage Vi as illustrated in FIG. 3. In a second more sophisticated mode of operation, each elementary photodetector (Edi) may be coupled to a smaller photodetector (edi) through a transistor (Ti). When a photodetection current appears on the photodetector (edi), a voltage appears controlling the connection of the photodetector (Edi) associated with the small elementary photodetector (edi) to the common line (Lc).

Another objective of the invention is a process for embodiment of this type of large photodetector and the various steps in this process will now be described.

Elementary photodetectors (Edi) are generated starting from a substrate (S), particularly a semiconductor. Typically, a GaAs type substrate, with a doped and more conductive GaAs layer on the surface, may be used in order to make electrical contacts.

Active layers may be made on this type of substrate, for example by epitaxial growth, in order to make elementary photodetectors with high sensitivity (and particularly structures with quantal sinks).

A second conducting layer made of doped GaAs is placed on the surface of these elementary photodetectors (Edi) in order to facilitate external contacts.

Figure 4A:
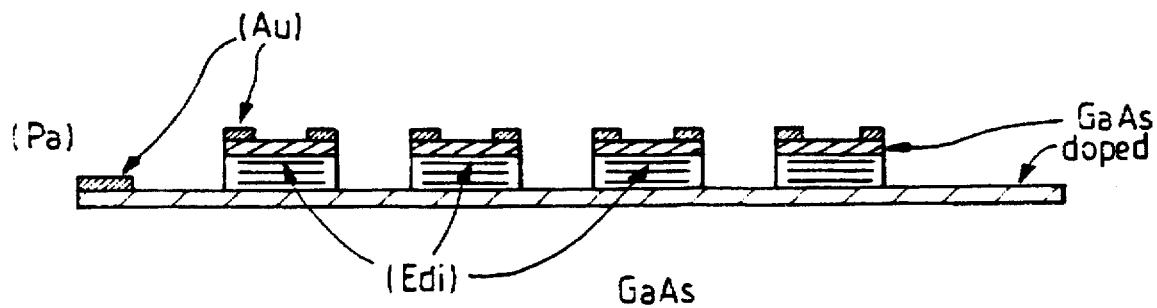
FIGS. 4a–4c illustrate the main steps of an example of the process according to the invention of making a large photodetector on a GaAs substrate using elementary photodetectors with quantal sink structures.
Figure 4B:
Figure 4C:
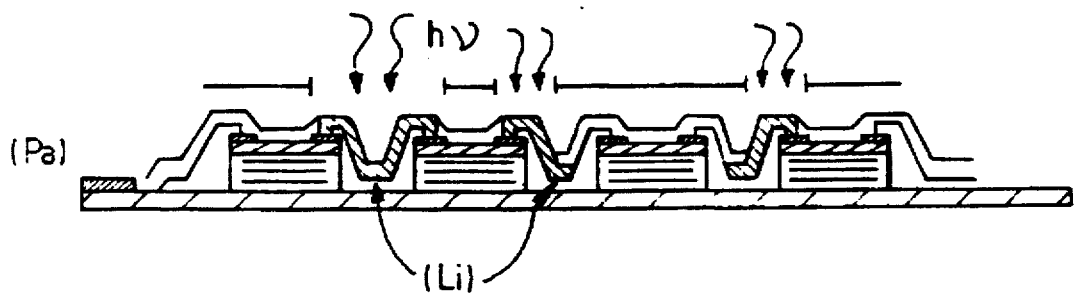

A "low" contact (Pa) is made locally on the substrate (S). The elementary photodetectors (Edi) are formed with the conducting areas being formed above the detectors by metallic deposit (typically gold will be used). For a photodetector designed to operate on a front surface, conducting areas are made around the periphery of the detector to allow the light flux to be detected to pass. FIG. 4a–4c illustrate the various steps in an example of the process according to the invention for producing photodetectors made on GaAs. FIG. 4a schematically shows the substrate with these photodetectors and the low contact (Pa). The same result can also be obtained from a substrate (s) on which the doped GaAs layers, structures with quantal sinks, and the doped GaAs layer, have been deposited in sequence. Secondly, metal deposits are made locally (in order to act as the higher photodetector electrodes). The assembly may be engraved locally by reactive ionic or chemical engraving in order to define elementary photodetectors.

FIG. 4b illustrates another step in the process according to the invention which will locally cover the structure described in FIG. 1a by insulation; it may advantageously be an $SiO_2$ or $Si3N_4$ type insulation, or an organic material such as polyimide or a PMMA type polymer.

When the various photodetectors ((Edi) have been created, they are individually subjected to a correct operating test.

In general, defects that can exist in semiconductor materials used in photodetectors are electrically active defects which lead to dark currents inside a photodetector very much higher than the normal. Therefore, they can easily be identified by electrical measurement either at ambient or at a lower temperature (for infrared detectors operating at about 10 μm, a tester is used under the 77 K peak to show up large dark currents and thus to identify defective photodetectors).

When it is determined which of the photodetectors $(Edi)_1$ are in good operating condition, all these photodetectors are connected in parallel. This is done by selective metallizing in order to define the conducting portions such as conducting elements (Ci) and lines (Li and Lc) to which the different detectors (Edi) will be connected. Thus initially, metallic branch lines (Li) may be defined (particularly using gold) on insulating areas.

Connections of good elements $(Edi)_1$ to the common conducting portions may then be made in different ways. It is possible to deposit a resin with a metal filler. By local heating with an excimer***** laser, it is possible to evaporate the resin and leave only the metal. Areas not irradiated by the laser and which are still covered with charged resin may then be dissolved, and only irradiated areas will be metallized as shown on FIG. 4c. In this figure, the laser is shown schematically by the notation hu, irradiated and therefore metallized areas become dark compared with non-irradiated areas of filled resin to be eliminated chemically.

With other processes for using the excimer laser, it is also possible to metallize the entire surface of the substrate, and then use the excimer laser to remove metallization on elements (Edi) that have tested as being defective and are not to be connected.

When all electrical connections have thus been set up between the various good elementary photodetectors $(Edi)_1$, the photodetector according to the invention is ready to operate the measurement being made between the contact (Pa) and the common conducting line (Lc).

We will describe two possible types of configurations for a photodetector according to the invention in which the elementary photodetectors (Edi) are coupled with small elementary photodetectors (edi) through transistors (Ti).

In the first case, two series of elementary photodetectors (for example layers with quantal sinks) are grown starting from a GaAs type substrate doped on the surface (n layer), each photodetector then being covered in turn by an n layer doped, for example, with GaAs. A transistor is then made on each element (Edi) using a p doped layer, then followed by an n doped layer as shown in FIG. 5a. The common n doped layer on the entire substrate being connected to a +V potential. Electrical contacts can then be made by wires between the upper n doped layer of the photodetector (edi) and the p doped layer of the photodetector (Edi).

In a second more elaborate configuration, electrical connections can be made by an insulating deposit between elementary photodetectors followed by a metal deposit as illustrated in FIG. 5b. The various elements (base, collector, emitter) making up the transistors (Ti) are shown on FIGS. 5a and 5b.

We claim:

1. A photodetector arrangement providing a large effective photodetecting area, said photodetector arrangement comprising:

a substrate;

a set of elementary photodetectors in an array on said substrate;

a common conductor line mounted on but insulated from said substrate;

a conductive connection portion mounted on but insulated from said substrate, said conductive connection portion providing a parallel connection from signal outputs associated with a selected plural number of the elementary photodetectors which have been found to be defect free, wherein the selected plural number is a number less than the full number of the elementary photodetectors provided in the array on said substrate;

wherein said elementary photodetectors are rectangular in shape;

a substrate surface contact, wherein the substrate surface contact and the common conductive line serve as output contacts for the photodetector arrangement;

wherein said conductive connection portion further comprises;

a connection control transistor coupled to each one of the elementary photodetectors to provide said connection from the signal outputs associated with the particular ones of the elementary photodetectors to said common conductor line only when a said control transistor is in a conductive condition;

a control photodetector mounted on said substrate near each elementary photodetector;

a control connection between each control photodetector and a control input of a respective associated one of the control transistors, and wherein each control photodetector receiving control radiation generates a control signal at an associated control photodetector output that is conducted by said control connection to said control input to control said respective associated one of the control transistors to be in said conductive condition.

2. A photodetector arrangement providing a large effective photodetecting area, said photodetector arrangement comprising:

a substrate;

a set of elementary photodetectors in an array on said substrate;

a common conductor line mounted on but insulated from said substrate;

a conductive connection portion mounted on but insulated from said substrate, said conductive connection portion providing a parallel connection from signal outputs associated with a selected plural number of the elementary photodetectors which have been found to be defect free, wherein the selected plural number is a number less than the full number of the elementary photodetectors provided in the array on said substrate;

wherein said array is a matrix away;

a substrate surface contact, wherein the substrate surface contact and the common conductive line serve as output contacts for the photodetector arrangement;

wherein said conductive connection portion further comprises;

a connecting control transistor coupled to each of the elementary photodetectors to provide said connection from the signal outputs associated with particular one of the elementary photodetectors to aid common conductor line only when a said control transistor is in a conductive condition, a control photodetector mounted on said substrate near each elementary photodetector, a control connection between each control photodetector and a control input a respective associated one of the control transistors, and wherein each control photodetector receiving control radiation generates a control signal at an associated control photodetector output that is conducted by said control connection to said control input to control said respective associated one of the control transistors to be in said conductive condition.

3. A photodetector arrangement providing a large effective photodetecting area adjustable to various proportions, said photodetector arrangement comprising:

a substrate;

a set of elementary photodetectors in an array on said substrate;

a common conductor line mounted on but insulated from said substrate;

a connection control;

a connection control transistor coupled to each one of the elementary photodetectors to provide a connection from signal outputs associated with a selected plural number of elementary photodetectors to provide the combined outputs of the selected plural number of elementary photodetection to said common conductor line in response to the connection control rendering selected control transistors conductive to provide the adjustable effective photodetecting area;

wherein said connecting control further comprises:

a control photodetector mounted on said substrate near each elementary photodetector, a control connection between each control photodetector and a control input of a respective associated one of the control transistors, and wherein each control photodetector receiving radiation generates a control signal at an associated control photodetector output that is conducted by said control connection to said control input to control said respective associated one of the control transistors to be conductive to automatically adjust the proportions of the array of elementary photodetectors to the proportions of a particular area of radiation impinging on said array.

* * * * *